(12) United States Patent
Jiang (10) Patent No.: US 10,203,770 B2
(45) Date of Patent: Feb. 12, 2019

(54) KEYBOARD DEVICE FOR ELECTRONIC APPARATUS

(71) Applicant: BOE TECHNOLOGY GROUP CO., LTD., Beijing (CN)

(72) Inventor: Feng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/528,741

(22) PCT Filed: May 30, 2016

(86) PCT No.: PCT/CN2016/083879
§ 371 (c)(1),
(2) Date: May 22, 2017

(87) PCT Pub. No.: WO2017/156882
PCT Pub. Date: Sep. 21, 2017

(65) Prior Publication Data
US 2018/0059800 A1 Mar. 1, 2018

(30) Foreign Application Priority Data

Mar. 14, 2016 (CN) .......................... 2016 1 0143584

(51) Int. Cl.
*G06M 1/34* (2006.01)
*G06F 3/02* (2006.01)
(Continued)

(52) U.S. Cl.
CPC .............. *G06F 3/0221* (2013.01); *G06F 1/16* (2013.01); *G06F 1/1669* (2013.01);
(Continued)

(58) Field of Classification Search
CPC ........... G06C 7/02; G06C 7/05; G06F 3/0221; G06F 1/1669; G06F 3/0208; G06F 3/03547; G06F 3/044
(Continued)

(56) References Cited

U.S. PATENT DOCUMENTS 6,774,888 B1 8/2004 Genduso
2002/0050934 A1* 5/2002 Olodort ................. G06F 3/0221
341/22
(Continued)

FOREIGN PATENT DOCUMENTS

CN 2783405 Y 5/2006
CN 201673433 U 12/2010
(Continued)

OTHER PUBLICATIONS

International Search Report and Written Opinion dated Dec. 21, 2016, for corresponding PCT Application No. PCT/CN2016/083879.
(Continued)

*Primary Examiner* — Karl D Frech
(74) *Attorney, Agent, or Firm* — Kinney & Lange, P.A.

(57) ABSTRACT

A keyboard device according to one embodiment includes: a box-shape body, comprising a first side-wall and a second side-wall arranged opposite to and is pivotably openable relative to the first side-wall; a support assembly, configured to be connected detachably to the first side-wall of the box-shape body such that the box-shape body is adapted to support the electronic apparatus; and a flexible membrane keyboard which is connected with an internal surface of the second side-wall of the box-shape body and switchable between an unfolded condition in which the flexible membrane keyboard functions as a keyboard of the electronic apparatus and a folded condition in which the flexible membrane keyboard is received within the box-shape body. The keyboard device of the embodiments of the disclosure may function as both a keyboard for the electronic device and a support, and is provided with a limited size so as to facilitate portability thereof.

20 Claims, 7 Drawing Sheets

(51) Int. Cl.
*G06F 1/16* (2006.01)
*G06F 3/0354* (2013.01)
*G06F 3/044* (2006.01)
*H03K 17/96* (2006.01)

(52) U.S. Cl.
CPC ........ *G06F 3/0208* (2013.01); *G06F 3/03547* (2013.01); *G06F 3/044* (2013.01); *H03K 17/9622* (2013.01); *H03K 2217/960775* (2013.01)

(58) Field of Classification Search
USPC ...................................... 235/145 R; 345/168
See application file for complete search history.

(56) References Cited

U.S. PATENT DOCUMENTS

| | | | |
|---|---|---|---|
| 2007/0176902 A1* | 8/2007 | Newman | G06F 1/1626 345/168 |
| 2011/0305493 A1 | 12/2011 | Wu et al. | |
| 2012/0009000 A1 | 1/2012 | Starrett | |

FOREIGN PATENT DOCUMENTS

| CN | 201974759 U | 9/2011 |
|---|---|---|
| CN | 20442364 U | 6/2015 |
| CN | 205608667 U | 9/2016 |
| WO | 2014057171 A1 | 4/2014 |

OTHER PUBLICATIONS

Chinese First Office Action, for Chinese Patent Application No. 201610143584.7, dated Sep. 1, 2017, 11 pages.

* cited by examiner

KEYBOARD DEVICE FOR ELECTRONIC APPARATUS

CROSS-REFERENCE TO RELATED INVENTION

The present disclosure claims the benefit of Chinese Patent Application Invention No. 201610143584.7 filed on Mar. 14, 2016 in the State Intellectual Property Office of China, the whole disclosure of which is incorporated herein by reference.

BACKGROUND OF THE INVENTION

Field of the Invention

Embodiments of the present disclosure relate to a keyboard device for a mobile electronic apparatus, and in particular, to a keyboard device having a support function.

Description of the Related Art

Mobile electronic apparatus, e.g., tablet computer, may bring convenience to people's daily life and work with the portability and diversity possessed by themselves. In comparison with traditional desktop computer or laptop computer, such tablet computer is at a disadvantage in the aspect of processing traditional office tasks (e.g., document recording, and data sorting). Therefore, by way of example, the tablet computer is provided with a separated physical keyboard for facilitating use thereof. However, due to the fact that existing physical keyboard is provided with a relatively large size, it is not flexible enough in structure and thus inconvenient to carry along therewith.

SUMMARY OF THE INVENTION

In an embodiment of the disclosure, a keyboard device for an electronic apparatus is provided, comprising: a box-shape body, comprising a first side-wall and a second side-wall arranged to be opposite to and pivotably openable relative to the first side-wall; a support assembly, configured to be connected detachably to the first side-wall of the box-shape body such that the box-shape body is adapted to support the electronic apparatus; and a flexible membrane keyboard which is connected with an internal surface of the second side-wall of the box-shape body and switchable between an unfolded condition in which the flexible membrane keyboard functions as a keyboard of the electronic apparatus and a folded condition in which the flexible membrane keyboard is received within the box-shape body.

According to an embodiment of the disclosure, the support assembly comprises three legs, and the first side-wall of the box-shape body is provided with three receiving holes arranged side by side; and the three legs of the support assembly are operatable to switch between a retracted condition in which the three legs are correspondingly accommodated within the three receiving holes respectively and an operating condition in which one of the three legs is accommodated within a corresponding receiving hole while the other two of the three legs are removed from respective receiving holes such that the three legs form collectively a tripod.

According to an embodiment of the disclosure, the receiving hole is provided within the first side-wall and arranged to extend in parallel with a surface of the first side-wall.

According to an embodiment of the disclosure, the support assembly further comprises a support head to which the three legs are rotatably connected.

According to an embodiment of the disclosure, the three legs are rotatably connected to the support head via a mortise-tenon joint structure.

According to an embodiment of the disclosure, the support head comprises a first head portion, a second head portion and a third head portion which are not only pivotably interconnected but also connected to the three legs correspondingly and respectively; and the first head portion, the second head portion and the third head portion line up in the retracted condition in which the three legs are accommodated within the receiving holes of the box-shape body respectively, and form a triangular construction in the operating condition of the three legs.

According to an embodiment of the disclosure, the flexible membrane keyboard is provided with a plurality of zones, one of which is connected to the internal surface of the second side-wall of the box-shape body and functions as a primary zone, and the other of which function as secondary zones, with folding zones being provided between neighboring ones of the plurality of zones such that the secondary zones of the flexible membrane keyboard are foldable along surrounding folding zones onto the primary zone to be accommodated completely within the box-shape body.

According to an embodiment of the disclosure, the folding zones between neighboring zones are flexible folding zones.

According to an embodiment of the disclosure, the plurality of zones are distributed in a matrix configuration.

According to an embodiment of the disclosure, the plurality of zones are nine zones distributed in a 3×3 matrix configuration in which the primary zone is located in a first row.

According to an embodiment of the disclosure, one of the plurality of zones functions as a touch pad.

According to an embodiment of the disclosure, the flexible membrane keyboard comprises customized function keys which support the use of specific application software of the electronic apparatus.

According to an embodiment of the disclosure, in a case that the second side-wall and the first side-wall have closed towards each other, the box-shape body forms therebetween an accommodation space which is configured to accommodate at least one selected from a group consisting of the electronic apparatus and a business card.

According to an embodiment of the disclosure, the keyboard device further comprises a stop which is provided on one of the internal surface of the second side-wall and an internal surface of the first side-wall to stop the electronic apparatus provided on the keyboard device.

According to an embodiment of the disclosure, a pivot shaft is provided between the first side-wall and the second side-wall to pivot the latter; and the stop is a strip-shaped stop extending along the pivot shaft and provided within a region of the internal surface of the second side-wall next to the pivot shaft.

According to an embodiment of the disclosure, the stop integrates one selected from a group consisting of following modules: a Bluetooth module, a power supply module, an IC module, a USB module, a LED module, and any combination thereof.

According to an embodiment of the disclosure, the flexible membrane keyboard is a capacitive flexible membrane keyboard.

According to an embodiment of the disclosure, the capacitive flexible membrane keyboard comprises a key region which is provided with a fundamental structure comprising: a flexible substrate positioned at a bottom thereof; and a lower sensing electrode, an insulation layer, an upper common electrode and a protective layer which are stacked in sequence on the flexible substrate, and the key region apperceives by means of touch, and the upper common electrode is configured to be strip-shaped conductive bands which are distributed in a first direction and in communication with one another, while the lower sensing electrode is configured to be strip-shaped conductive bands which are distributed to extend in a second direction at an angle to the first direction and in communication with one another.

According to an embodiment of the disclosure, the upper common electrode is configured to be strip-shaped conductive bands which are distributed to extend in the first direction parallel to the flexible substrate and in communication with one another, and the lower sensing electrode is configured to be strip-shaped conductive bands which are distributed to extend in the second direction orthogonal to the first direction for the upper common electrode and in communication with one another.

According to an embodiment of the disclosure, the flexible membrane keyboard is formed by a material selected from a group consisting of polyester (PET), polyimide (PI), and polymethyl methacrylate (PMMA).

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which:

FIG. 1b illustrates a front view of the keyboard device of the embodiment shown by FIG. 1a;

FIG. 1c illustrates a top view of the keyboard device of the embodiment shown by FIG. 1a;

FIG. 2b illustrates a front view of the keyboard device of the embodiment shown by FIG. 2a;

FIGS. 3a to 3b illustrate schematic views of different operating conditions of a tripod in the keyboard device of the embodiment shown by FIG. 1a;

FIGS. 4a and 4b illustrate schematic views of different bonding conditions between the tripod and respective side-wall of the box-shape body of the embodiment shown by FIG. 1a;

FIG. 5 illustrates a schematic view of the various components of a stop in the keyboard device of the embodiments shown by FIG. 1a or 2a;

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the keyboard device.

The keyboard device provided by the embodiments of the disclosure is capable of folding and unfolding, corresponding to a folded condition and an unfolded condition of the keyboard device, respectively. The keyboard device is in a form of a flattened-shape box in the folded condition, which box is capable of being arranged horizontally or vertically, by way of example.

According to a general technical concept of the present disclosure, there is provided a keyboard device for an electronic apparatus, comprising: a box-shape body, comprising a first side-wall and a second side-wall arranged to be opposite to and pivotably openable relative to the first side-wall; a support assembly, configured to be connected detachably to the first side-wall of the box-shape body such that the box-shape body is adapted to support the electronic apparatus; and a flexible membrane keyboard which is connected with an internal surface of the second side-wall of the box-shape body and switchable between an unfolded condition in which the flexible membrane keyboard functions as a keyboard of the electronic apparatus and a folded condition in which the flexible membrane keyboard is received within the box-shape body.

Figure 1A:
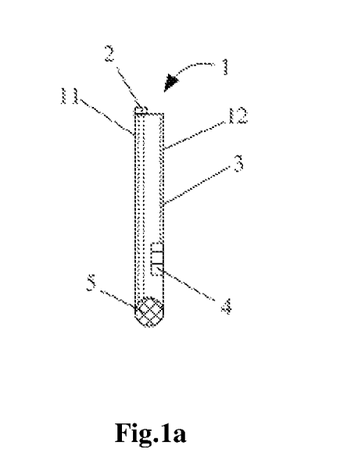
FIG. 1a illustrates a side view of a keyboard device in a storage condition according to an embodiment of the disclosure.
Figure 1B:
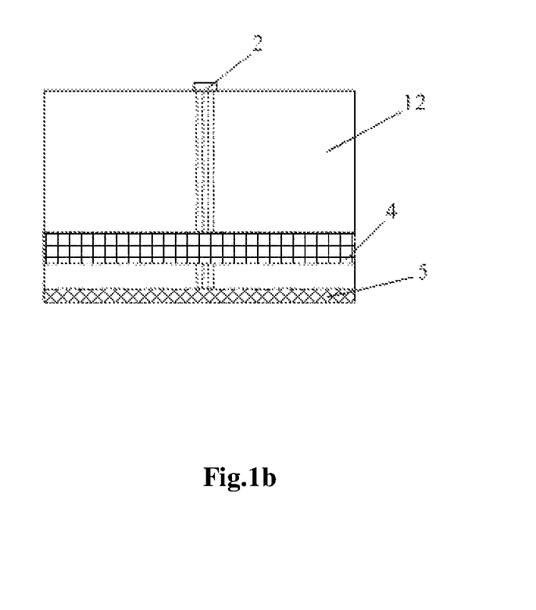
Figure 1C:
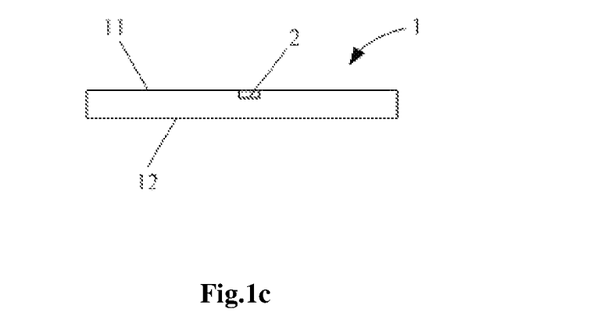
Figure 2A:
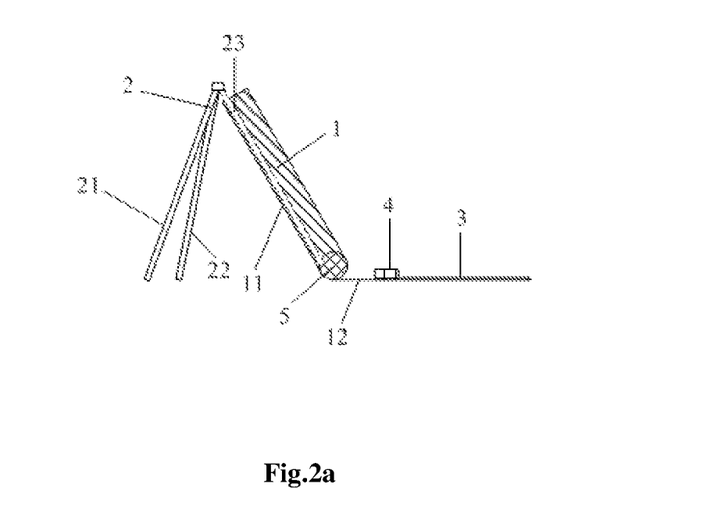
FIG. 2a illustrates a side view of the keyboard device shown by FIG. 1a, in a usage condition in which a flexible membrane keyboard of the keyboard device is in a folded condition.

FIG. 1a illustrates a side view of the keyboard device which is disposed vertically in a folded condition (also referred to as "storage condition") according to an embodiment of the disclosure. FIG. 1b illustrates a front view of the keyboard device of the embodiment shown by FIG. 1a. And FIG. 1c illustrates a top view of the keyboard device of the embodiment shown by FIG. 1a. As illustrated in FIGS. 1a-1c, the keyboard device is in a form of a substantially rectangular flattened-shape box in the folded condition thereof, and comprises a box-shape body 1 which is not restricted in length, width and thickness dimensions thereof with a length matched with the electronic apparatus to be placed therein. One exemplary embodiment is, for example, the dimensions thereof indicated by length, width and thickness are 110 mm×75 mm×10 mm. And the box-shape body 1 is provided with a first side-wall 11 and a second side-wall 12 arranged opposite to each other, and the second side-wall is pivotably openable relative to the first side-wall 11 around a round rotational shaft 5 located at a bottom portion of the box-shape body so as to open the box-shape body, such that the keyboard device is in a usage condition and the electronic apparatus accommodated within the box-shape body is thus exposed, as illustrated in FIG. 2a. The first side-wall 11 and the second side-wall 12 of the disclosure for example function as two box covers of the box-shape body respectively.

When the box-shape body 1 is placed vertically as illustrated in FIG. 1a, specifically, the bottom portion of the box-shape body 1 may comprise the round rotational shaft 5 which connects the first side-wall 11 with the second side-wall 12, such that the box is pivotably openable and closable around the round rotational shaft 5. When the box-shape body 1 closes, it forms the accommodation space between the first side-wall 11 and the second side-wall 12, which accommodation space may be configured to accommodate the electronic device or a business card, for example.

Figure 2B:
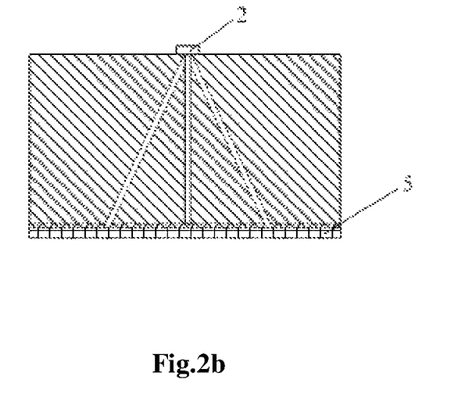
Figure 2C:
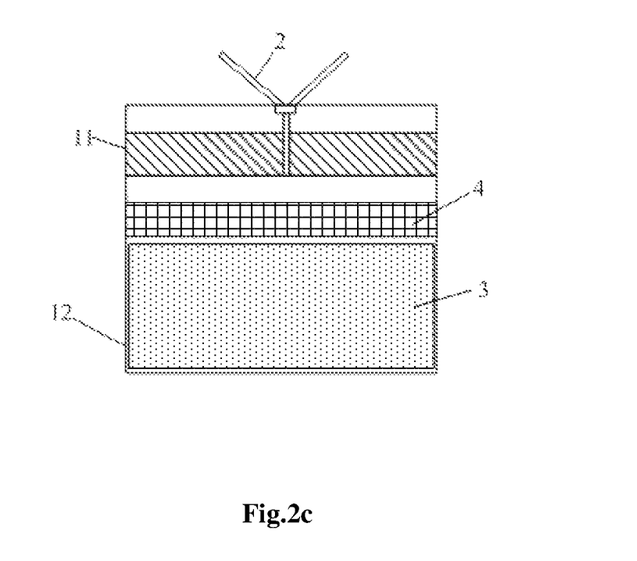
FIG. 2c illustrates a top view of the keyboard device of the embodiment shown by FIG. 2a, in which the flexible membrane keyboard of the keyboard device is in a folded condition in which it has not been unfolded yet.

FIG. 2a illustrates a side view of the keyboard device shown by FIG. 1a, in a usage condition, and the keyboard device further comprises a flexible membrane keyboard 3 which may be fixed or connected to an internal surface of the second side-wall 12 of the box-shape body 1, e.g., by adhesion, snap-fit at edges, and/or restriction at tab(s). The flexible membrane keyboard is switchable between a folded condition and an unfolded condition. As illustrated in FIG. 2a, the flexible membrane keyboard 3 of the keyboard device is in a folded condition; FIG. 2b illustrates a front view of the keyboard device of the embodiment shown by FIG. 2a; FIG. 2c illustrates a top view of the keyboard device of the embodiment shown by FIG. 2a, in which the flexible membrane keyboard 3 is still in a folded condition; and FIG. 2d illustrates a top view of the keyboard device of the embodiment shown by FIG. 2c, in another condition in which the flexible membrane keyboard 3 is in an unfolded condition already.

As illustrated in FIGS. 1a to 1c and FIGS. 2a to 2d, the keyboard device further comprises the support assembly 2, which is connected detachably to an upper side edge of the first side-wall 11 of the box-shape body 1 away from the round rotational shaft 5 of the box-shape body 1; the support assembly 2 may support the first side-wall 11 when it is in the condition as illustrated in FIG. 2a, i.e., is unfolded from the first side-wall 11, such that the first side-wall 11 of the box-shape body 1 is adapted to cooperate with the support assembly 2 to support the electronic apparatus (e.g. a tablet computer) which is fixed onto the first side-wall. FIG. 2a illustrates the keyboard device shown by FIG. 1a, in a usage condition in which the keyboard device functions as the support of the electronic apparatus, and by way of example, the electronic apparatus (e.g. a tablet computer) is fixed or connected onto the first side-wall 11 of the box-shape body 1 by resting against the latter.

Figure 2D:
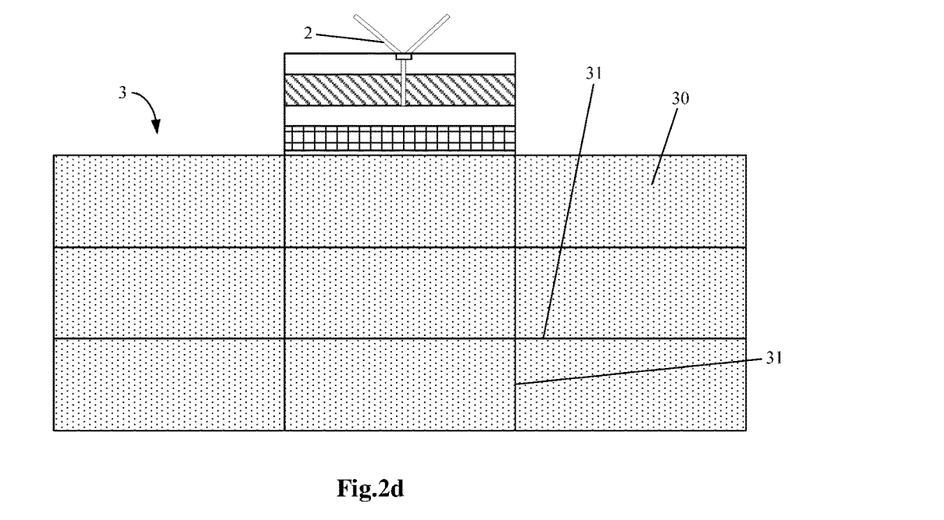
FIG. 2d illustrates a top view of the keyboard device of the embodiment shown by FIG. 2c, in another condition in which the flexible membrane keyboard of the keyboard device is in an unfolded condition.

The folded condition of the flexible membrane keyboard 3 is illustrated in FIG. 2c while the unfolded condition thereof is illustrated in FIG. 2d. In the folded condition, the flexible membrane keyboard is adapted to be received within the box-shape body 1 when the second side-wall 12 closes towards the first side-wall 11, and abuts against the electronic apparatus which is received between the first side-wall 11 and the second side-wall 12, as illustrated in FIG. 1a. In the unfolded condition, as illustrated in FIG. 2d, the flexible membrane keyboard 3 is adapted to function as an external keyboard for the electronic apparatus.

Specifically, according to an embodiment, as illustrated in FIGS. 1a-1c and FIGS. 2a-2d, as well as FIGS. 3a-3b and FIGS. 4a-4b, the support assembly 2 comprises three legs 21, 22, 23 which joints at a head portion 24. Correspondingly, the first side-wall 11 of the box-shape body 1 is provided with three receiving holes 10 which are arranged side by side. The receiving holes 10 open at the upper side edge of the first side-wall 11 for accommodating the three legs respectively. The support 2 is operable to switch between a retracted condition and an operating condition. In the retracted condition, as illustrated in FIGS. 1a-1c, and FIGS. 3b and 4a, the three legs 21, 22, 23 are accommodated within the three receiving holes; and in the operating condition, as illustrated in FIGS. 2a-2c and FIGS. 3a and 4b, one of the three legs 21, 22, 23, e.g., a centralized leg 23, is accommodated within a corresponding receiving hole 10, which are arranged side by side, of the box-shape body 1 respectively, while the other two of the three legs are adapted to be removed from respective receiving holes to cooperate with the leg 23 so as to form collectively a tripod which branches and extends from the head portion 24. The support assembly of the exemplary embodiment is simple in structure and manufacturing processes thereof, and thus is capable of being accommodated within the box-shape body without occupying additional space, facilitating portability thereof.

According to another embodiment of the disclosure, as illustrated in FIGS. 3a-3b and FIGS. 4a-4b, the support assembly 2 further comprises a support head 24 to which the three legs 21, 22, 23 are rotatably connected, e.g., by a mortise-tenon joint structure. Therefore, angles among the three legs 21, 22, 23 relative to the support head 24 may be adjusted readily in use, e.g., the support assembly may carry out an opening-and-closing motion in a certain direction and at a certain angle, so as to adjust an installation angle of the electronic apparatus.

Figure 3A:
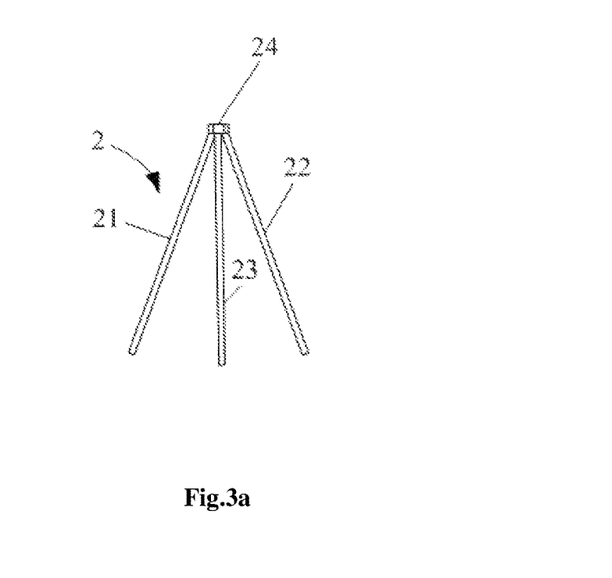
Figure 3B:
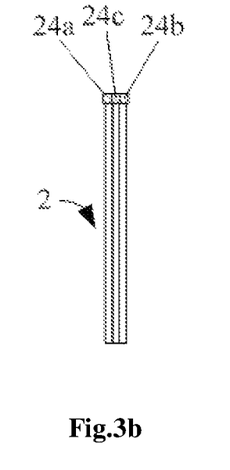
Figure 4A:
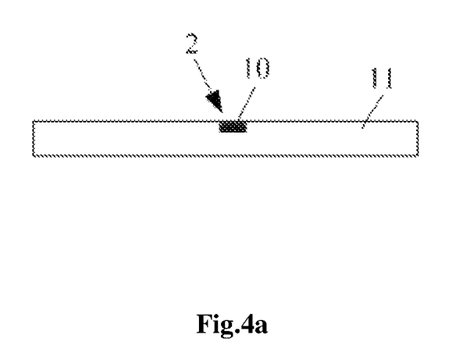
Figure 4B:
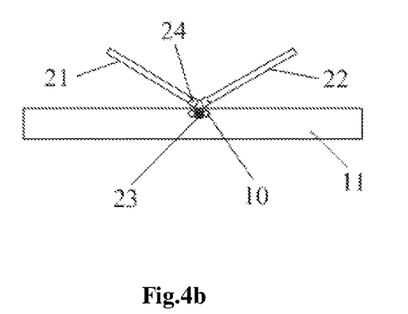

Specifically, the support head 24 may comprise a first head portion 24a, a second head portion 24b and a third head portion 24c which are not only pivotably interconnected but also connected to the three legs 21, 22, 23 correspondingly and respectively. As illustrated in FIGS. 3b and 4a, the first head portion 24a, the second head portion 24b and the third head portion 24c line up in a linear arrangement when the three legs 21, 22, 23 are accommodated within the parallel receiving holes 10, which are arranged side by side, of the box-shape body 1 respectively. As illustrated in FIG. 4b, the first head portion 24a, the second head portion 24b and the third head portion 24c form a triangular construction when the three legs 21, 22, 23 form the tripod. Therefore, when the support assembly is not in use, for example, the legs may be accommodated within the receiving holes in a concentrated manner and conveniently; and when the support assembly is in use, the angles among the three legs may be adjusted readily.

Figure 6:
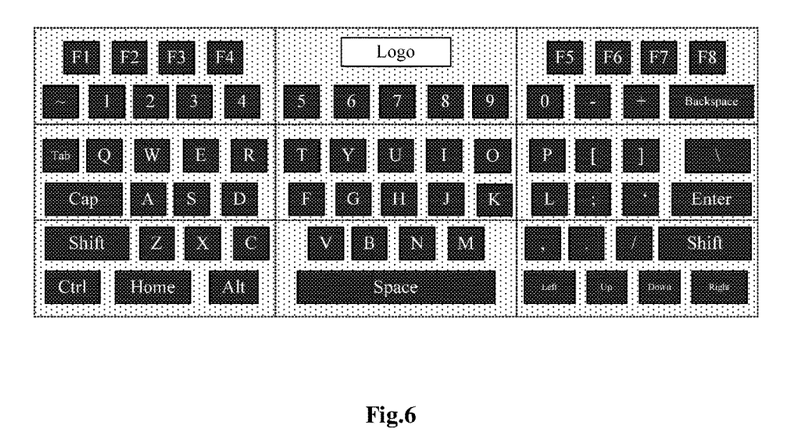
FIG. 6 illustrates a schematic view of the flexible membrane keyboard of the keyboard device of the embodiment shown by FIG. 1a or 2a, in an unfolded condition.

As illustrated in FIG. 2d and FIG. 6, according to an embodiment, the flexible membrane keyboard 3 is provided with zones distributed in a matrix configuration, e.g., nine zones 30 which are distributed in a 3×3 matrix configuration, i.e., form a typical nine-patch Sudoku structure, with a unfolded dimension of 32 cm×13.5 cm, i.e., a typical dimension for a portable keyboard. One zone 30 of the nine zones 30 of the flexible membrane keyboard 3 is connected to the internal surface of the second side-wall 12 of the box-shape body 1 and functions as a primary zone, while the other zones function as secondary zones, with folding zones 31 being provided between neighboring zones such that respective one of the secondary zones of the flexible membrane keyboard 3 may be folded along surrounding folding zones onto the primary zone so as to be accommodated completely within the box-shape body 1. By way of example, the primary zone is located in a first row most adjacent to the round rotational shaft and arranged centrally within the distribution in above 3×3 matrix configuration. For example, a logo region in the nine-patch Sudoku structure is adhered to an internal side of the second side-wall 12 of the box-shape body 1 to cooperate with each other so as to function as the primary zone, while other zones function as the secondary zones, e.g., folded onto the primary zone. FIG. 2c illustrates the flexible membrane keyboard of the embodiment in the folded condition. By way of example, the flexible membrane keyboard 3 has an area of 4.5 cm*10.5 cm when folded, so as to be stored in the box-shape body 1 conveniently.

In an embodiment, the folding zones between neighboring zones are flexible folding zones, for facilitating folding thereof. The keyboard corresponding to various zones may be a flexible one, for example; or may be a non-flexible one, e.g., a hard plastic keyboard.

Though it is illustrated that the flexible membrane keyboard is provided with nine zones, it is just an example, and the flexible membrane keyboard may be provided with other numbers of zones as desired.

As illustrated in FIG. 6, for example, the flexible membrane keyboard 3 is provided with all the keys as in an ordinary keyboard, so as to meet the requirement of processing daily work by a tablet computer. In addition, by way of example, the flexible membrane keyboard 3 further comprises a plurality of function keys which may be configured to perform control function e.g., by a customized application software (i.e., app), such that the functions of the keyboard device may be expanded so as to optimize usage mode of the keyboard and to enhance user experience.

A first example of the customized app may be an electronized business card holder. By way of example, the box-shape body of the keyboard device may function as a support for the tablet computer when opened and as a storage box for the flexible membrane keyboard when closed, and may also be used as a business card holder. In a case that physical business cards are increased, these business cards may be electronized by associated app in the tablet computer. Specifically, e.g., a dedicated app which associates the keyboard device with the business card holder may be designed such that a series of actions may be accomplished by the function keys of the keyboard, for example, opening the app and a camera to input images (which is required to be performed by the user), performing character recognition on the basis of the images, inputting information of the business card, completing and/or modifying the information of the business card by the keyboard, and saving the information of the business card.

A second example of the customized app may be a usage of the flexible membrane keyboard 3 to function as a shortcut way for opening the app. By a dedicatedly designed app, the function keys are associated with the app which is self-defined by the user. When the keyboard is connected with the tablet computer, for example, corresponding app may be opened with a one-key operation by the function keys and then complete related operation(s). For example, once a user opens an app which is configured for the self-defined keyboard, a function key may be edited in a self-defined manner, e.g., to open an email app. After the email app is opened, the user may further self-define other function keys to complete common-function operations such as receiving and sending email, and writing email. A purpose of this exemplary design lies in that, a touch screen of the tablet computer itself is completely not used by the user any longer to perform common operations, when an external keyboard is used, so as to enhance efficiency of the user in using the keyboard.

Besides, in another alternative embodiment, in addition to the keys of an ordinary keyboard, the flexible membrane keyboard 3 may further use one of the nine zones as a touch pad, for example. As such, the touch pad of the flexible membrane keyboard may be used instead of the touch pad of an electronic apparatus, facilitating operation of the electronic apparatus.

In the unfolded condition, for example, the flexible membrane keyboard 3 may be used as an ordinary keyboard to operate the electronic apparatus. In the folded condition, as illustrated in FIG. 1a, the flexible membrane keyboard 3 may be accommodated within the box-shape body 1, e.g., with the closure of the second side-wall of the box-shape body 1, facilitating portability thereof.

Figure 7:
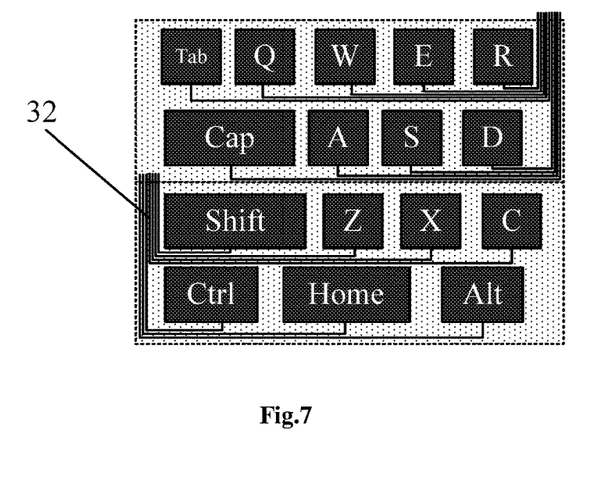
FIG. 7 illustrates a schematic view of a portion of wirings in the flexible membrane keyboard of the embodiment shown by FIG. 6.

FIG. 7 illustrates a schematic view of a portion of wirings 32 in the flexible membrane keyboard of the embodiment shown by FIG. 6. As illustrated in FIG. 7, the wirings 32 in the flexible membrane keyboard 3 is for example distributed along edges of the keyboard, such that the effect of folding upon the wirings may be minimized. By way of example, the wirings 32 of the keyboard may be formed by using a foldable flexible printed circuit (FPC), such that a minimal foldable number throughout its service life of e.g., 100, 000 may be ensured. Furthermore, by way of example, a design of a double-layered PCB may be utilized so as to ensure its service life.

As illustrated in FIGS. 1a, 1b, 2a and 2c, a keyboard device according to an embodiment of the disclosure is further provided with a stop 4, which is a protruding strip-shaped stop provided on the internal surface of the second side-wall 12 of the box-shape body 1 with an exemplary dimension of 11 cm (length)×1.6 cm (width)×0.5 cm (thickness) and is adjacent to (e.g., at a distance of about 1.5 cm from) the round rotational shaft 5 of the box-shape body and parallel to the rotational shaft 5 of the second side-wall 12 pivoting around the first side-wall 11. As such, as illustrated in FIG. 2a, when the keyboard device is used as the support of the electronic apparatus, the electronic apparatus abuts against the first side-wall 11 of the box-shape body, for example, while the stop 4 helps in realizing a stabilized support for the electronic apparatus.

Even though the stop 4 is illustrated to be provided on the internal surface of the second side-wall 12, however, by way of example, the stop may be alternatively provided on the internal surface of the first side-wall as desired, for stopping the electronic apparatus provided on the keyboard device.

Figure 5:
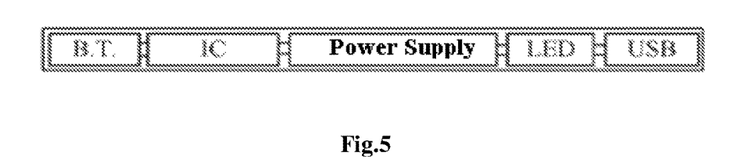

According to an embodiment, within the stop 4, there are integrated with a Bluetooth module, a power supply module, an IC module, a USB module, a LED module, and any combination thereof, so as to complete the functions of the keyboard device when used as a keyboard, or to provide additional function(s). FIG. 5 illustrates a schematic view of an embodiment of the various components of the stop 4. As illustrated in FIG. 5, a Bluetooth module, a power supply module, an IC module, a USB module, and a LED module are integrated within the stop 4. The shape and dimension of the stop 4 vary, e.g., depending on shapes and dimensions of various functional modules therein, so as to meet the dimensional requirements thereof and to implement the function of fixing the electronic apparatus in position when it stands upright as a tablet computer, simultaneously. For example, the tablet computer implement a wired connection to the keyboard and then a charging operation thereon, via a USB cable by a USB module integrated internally within the stop 4.

Figure 8:
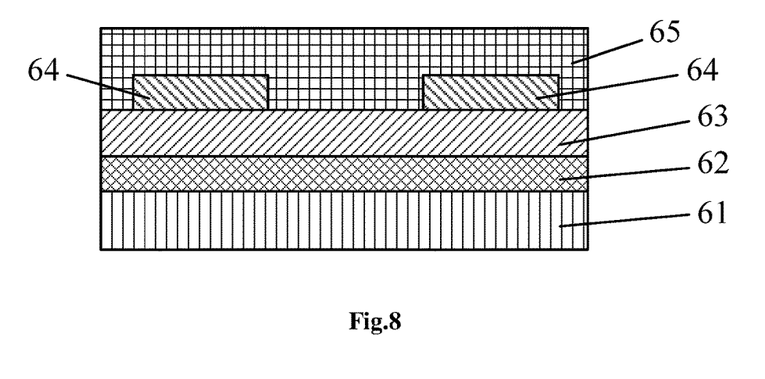
FIG. 8 illustrates a schematic view of a structure of keys in the flexible membrane keyboard of the embodiment shown by FIG. 6.

According to an embodiment, the flexible membrane keyboard 3 is for example a capacitive flexible membrane keyboard, with a fundamental construction and an operating principle similar to those of a touch screen. FIG. 8 illustrates a schematic view of a structure of keys in the flexible membrane keyboard of the embodiment shown by FIG. 6. As illustrated in FIG. 8, a fundamental structure of the keys comprises: a flexible substrate 61 positioned at a bottom thereof; and a sensing electrode 62, an insulation layer 63, a common electrode 64 and a protective layer 65 which are stacked in sequence on the flexible substrate. A region of the keys may apperceive by means of touch, and the upper common electrode is configured to be strip-shaped conductive bands which are distributed in a first direction and in communication with one another, while the lower sensing electrode is configured to be strip-shaped conductive bands which are distributed to extend in a second direction at an angle to the first direction and in communication with one another. In a further exemplary embodiment, e.g., the upper common electrode 64 may be strip-shaped conductive bands which are distributed to extend in the first direction parallel to the flexible substrate and in communication with one another, and the lower sensing electrode 62 may be strip-shaped conductive bands which are distributed to extend in the second direction orthogonal to the first direction for the upper common electrode 64 and in communication with one another. When touched by fingers, the capacitances of the upper and the lower electrodes change, and signals thus caused are transferred by the flexible printed circuit (FPC) to an integrated circuit (IC) to be further processed for recognition. As to the region of keys, a dimension of lines of respective electrode and a spacing thereamong are both sized to be large enough, so as to ensure that a touch or click action by a single key is identified while touch or click actions acting on adjacent different keys are distinguished simultaneously to eliminate interference. As far as a usage of the touch-interactive technology is concerned, other mainstream touch-interactive technology may also be adopted, for example.

The flexible membrane keyboard is formed by a material selected from: e.g., polyester (PET), polyimide (PI), polymethyl methacrylate (PMMA) hard plastic film material. Therefore, the specific material is selected such that the flexible keyboard is provided with characteristics such as bendable, foldable, and lightweight and slim, so as to decrease thickness and weight thereof to a large extent, facilitating portability.

As mentioned above, a keyboard device having a support function is provided in the embodiment of the disclosure, in which the flexible membrane keyboard is folded or curled to be received with the box-shape body of the keyboard device to form a keyboard box; and the keyboard box forms a support for an electronic apparatus (e.g., a tablet computer) when opened. Such a design may decrease the dimension of the keyboard significantly, so as to carry and use the keyboard device along with the tablet computer together.

Moreover, the keyboard device according to the embodiment of the disclosure may be also used as a physical business card holder. In a case that the keyboard device is used in cooperation with a specifically designed app, more control functions may be further implemented, e.g., activation of common application functions by a single key and implementation of a digitalized scanning function of a business card by a single key.

Various embodiments of the present application have been illustrated progressively, the same or similar parts of which can be referred to each other. The differences between each embodiment and the others are described in emphasis.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A keyboard device for an electronic apparatus, comprising:
   a box-shape body, comprising a first side-wall and a second side-wall arranged to be opposite to and pivotably openable relative to the first side-wall;
   a support assembly, configured to be connected detachably to the first side-wall of the box-shape body such that the box-shape body is adapted to support the electronic apparatus; and
   a flexible membrane keyboard which is connected with an internal surface of the second side-wall of the box-shape body and switchable between an unfolded condition in which the flexible membrane keyboard functions as a keyboard of the electronic apparatus and a folded condition in which the flexible membrane keyboard is received within the box-shape body,
   wherein the support assembly comprises three legs, and the first side-wall of the box-shape body is provided with three receiving holes arranged side by side; and
   wherein the three legs of the support assembly are operable to switch between a retracted condition in which the three legs are correspondingly accommodated within the three receiving holes respectively and an operating condition in which one of the three legs is accommodated within a corresponding receiving hole while the other two of the three legs are removed from respective receiving holes such that the three legs form a tripod collectively.

2. The keyboard device according to claim 1, wherein each receiving hole is provided within the first side-wall and arranged to extend in parallel with a surface of the first side-wall.

3. The keyboard device according to claim 1, wherein the support assembly further comprises a support head to which the three legs are rotatably connected.

4. The keyboard device according to claim 3, wherein the three legs are rotatably connected to the support head via a mortise-tenon joint structure.

5. The keyboard device according to claim 3, wherein
the support head comprises a first head portion, a second head portion and a third head portion which are not only pivotably interconnected but also connected to the three legs correspondingly and respectively; and
the first head portion, the second head portion and the third head portion line up in the retracted condition in which the three legs are accommodated within the receiving holes of the box-shape body respectively, and form a triangular construction in the operating condition of the three legs.

6. The keyboard device according to claim 1, wherein the flexible membrane keyboard is provided with a plurality of zones, one of which is connected to the internal surface of the second side-wall of the box-shape body and functions as a primary zone, and the other of which function as secondary zones, with folding zones being provided between neighboring ones of the plurality of zones such that the secondary zones of the flexible membrane keyboard are foldable along surrounding folding zones onto the primary zone to be accommodated completely within the box-shape body.

7. The keyboard device according to claim 6, wherein the folding zones between neighboring zones are flexible folding zones.

8. The keyboard device according to claim 6, wherein the plurality of zones are distributed in a matrix configuration.

9. The keyboard device according to claim 6, wherein the plurality of zones are nine zones distributed in a 3×3 matrix configuration in which the primary zone is located in a first row.

10. The keyboard device according to claim 6, wherein one of the plurality of zones functions as a touch pad.

11. The keyboard device according to claim 6, wherein the flexible membrane keyboard comprises customized function keys which support the use of specific application software of the electronic apparatus.

12. The keyboard device according to claim 1, wherein in a case that the second side-wall and the first side-wall have closed towards each other, the box-shape body forms therebetween an accommodation space which is configured to accommodate one selected from a group consisting of the electronic device and a business card.

13. The keyboard device according to claim 1, wherein the keyboard device further comprises a stop which is provided on one of the internal surface of the second side-wall and an internal surface of the first side-wall to stop the electronic device provided on the keyboard device.

14. The keyboard device according to claim 13, wherein a pivot shaft is provided between the first side-wall and the second side-wall to pivot the latter; and
the stop is a strip-shaped stop extending along the pivot shaft and provided within a region of the internal surface of the second side-wall next to the pivot shaft.

15. The keyboard device according to claim 13, wherein the stop integrates one selected from a group consisting of following modules: a Bluetooth module, a power supply module, an IC module, a USB module, a LED module, and any combination thereof.

16. The keyboard device according to claim 1, wherein the flexible membrane keyboard is a capacitive flexible membrane keyboard.

17. The keyboard device according to claim 16, wherein the capacitive flexible membrane keyboard comprises a key region which is provided with a fundamental structure comprising:
a flexible substrate positioned at a bottom thereof; and
a lower sensing electrode, an insulation layer, an upper common electrode and a protective layer which are stacked in sequence on the flexible substrate, and
wherein the key region apperceives by means of touch, and the upper common electrode is configured to be strip-shaped conductive bands which are distributed in a first direction and in communication with one another, while the lower sensing electrode is configured to be strip-shaped conductive bands which are distributed to extend in a second direction at an angle to the first direction and in communication with one another.

18. The keyboard device according to claim 17, wherein the upper common electrode is configured to be strip-shaped conductive bands which are distributed to extend in the first direction parallel to the flexible substrate and in communication with one another, and the lower sensing electrode is configured to be strip-shaped conductive bands which are distributed to extend in the second direction orthogonal to the first direction for the upper common electrode and in communication with one another.

19. The keyboard device according to claim 1, wherein the flexible membrane keyboard is formed by a material selected from a group consisting of polyester, polyimide, polymethyl methacrylate.

20. A keyboard device for an electronic apparatus, comprising:
a box-shape body, comprising a first side-wall and a second side-wall arranged to be opposite to and pivotably openable relative to the first side-wall;
a support assembly, configured to be connected detachably to the first side-wall of the box-shape body such that the box-shape body is adapted to support the electronic apparatus; and
a flexible membrane keyboard which is connected with an internal surface of the second side-wall of the box-shape body and switchable between an unfolded condition in which the flexible membrane keyboard functions as a keyboard of the electronic apparatus and a folded condition in which the flexible membrane keyboard is received within the box-shape body,
wherein the flexible membrane keyboard is provided with a plurality of zones, one of which is connected to the internal surface of the second side-wall of the box-shape body and functions as a primary zone, and the others of which function as secondary zones, with folding zones being provided between neighboring ones of the plurality of zones such that the secondary zones of the flexible membrane keyboard are foldable along surrounding folding zones onto the primary zone to be accommodated completely within the box-shape body.

* * * * *